United States Patent

[11] 3,605,033

[72] Inventor Hiroshi Nakamura
Tokyo, Japan
[21] Appl. No. 34,210
[22] Filed May 4, 1970
[45] Patented Sept. 21, 1971
[73] Assignee Fujitsu Limited
Kawasaki, Japan
[32] Priority May 7, 1969
[33] Japan
[31] 44-35041

[54] PHASE-CONTROLLED OSCILLATOR FOR PRODUCING A STABILIZED PHASE OUTPUT
7 Claims, 5 Drawing Figs.

[52] U.S. Cl. 331/12, 331/8, 331/17, 331/26, 331/36 C
[51] Int. Cl. H03b 3/04
[50] Field of Search 331/8, 11, 12, 17, 18

*Primary Examiner*—John Kominski
*Attorneys*—Curt M. Avery, Arthur E. Wilfond, Herbert L. Lerner and Daniel J. Tick

ABSTRACT: A phase-controlled oscillator has a loop comprising phase-detecting means, a loop filter connected to the phase-detecting means and a voltage-controlled oscillator connected to the phase-detecting means and the loop filter. The phase-detecting means compares an input signal with the output signal of the voltage-controlled oscillator. The phase-detecting means comprises a first phase detector coupling input means to the voltage-controlled oscillator. A second phase detector has a comparison phase which differs from that of the first phase detector by $\pi/2$ radians. The second phase detector is coupled to the input means. A voltage comparator coupled to the second phase detector discriminates the polarity of the output of the second phase detector. An inverter coupled to the first phase detector, to the voltage comparator and to the input means inverts the phase of the output of the first phase detector in accordance with the output of the voltage comparator and shifts the phase of the output of the phase-controlled oscillator by $\pi$ radians in accordance with the output of the voltage comparator.

FIG. 1

PHASE SHIFTER

PHASE-CONTROLLED OSCILLATOR FOR PRODUCING A STABILIZED PHASE OUTPUT

DESCRIPTION OF THE INVENTION

The invention relates to a phase-controlled oscillator. More particularly, the invention relates to a phase-controlled oscillator for producing a stabilized phase output.

A phase-controlled oscillator may be utilized in a bit synchronization circuit as well as in other types of circuits. The phase-controlled oscillator generally comprises a phase detector, a loop filter and a voltage-controlled oscillator. The input signal is compared with the output signal of the voltage-controlled oscillator in the phase detector of the phase-controlled oscillator. The frequency of oscillation of the voltage-controlled oscillator is controlled by the phase difference.

In a phase-controlled oscillator of known type, a phase detector having a cosine-type characteristic is utilized as a phase detector. Such phase detector comprises a ring modulator and produces a cosine wave output, since it provides the product of the input signal and the comparison signal. A phase detector of such type is generally utilized, since it is of simple structure. However, the phase detector has a defect or deficiency which is that a very long period of time is required for pulling in the phase from a point spaced or distant from the stable point by $\pi$ radians. This is due to the fact that in the cosine characteristic, the point of $\pi$ radians is zero, so that said point becomes an artificial stable point and the phase difference must be returned by $\pi$ radians.

The principal object of the invention is to provide a new and improved phase-controlled oscillator.

An object of the invention is to provide a phase-controlled oscillator for producing a stabilized phase output.

An object of the invention is to provide a phase-controlled oscillator which overcomes the difficulty of known similar types of oscillator.

An object of the invention is to provide a phase-controlled oscillator which rapidly pulls in the phase of a point distant from the stable point by $\pi$ radians.

An object of the invention is to provide a phase-controlled oscillator which rapidly pulls in the phase at any time position.

An object of the invention is to provide a phase-controlled oscillator which may be utilized in a bit synchronization circuit utilized for the demodulation of discontinuous time division signals such as, for example, burst signals.

An object of the invention is to provide a phase-controlled oscillator which produces a stabilized phase output with efficiency, effectiveness and reliability.

In accordance with the present invention, a phase controlled oscillator has a loop comprising phase-detecting means, a loop filter connected to the phase-detecting means and a voltage-controlled oscillator connected to the phase-detecting means and the loop filter. The voltage-controlled oscillator provides an output signal. The phase detecting means compares an input signal with the output signal of the voltage-controlled oscillator. Input means supplies an input signal to the phase-detecting means and output means derives the output signal from the voltage-controlled oscillator. The phase-detecting means comprises a first phase detector coupling the input means to the voltage-controlled oscillator. A second phase detector has a comparison phase which differs from that of the first phase detector by $\pi/2$ radians. The second phase detector is coupled to the input means. A voltage comparator is coupled to the second phase detector for discriminating the polarity of the output of the second phase detector. Inverter means is coupled to the first phase detector, to the voltage comparator and to the input means and inverts the phase of the output to the first phase detector in accordance with the output of the voltage comparator and shifts the phase of the output of the phase-controlled oscillator by $\pi$ radians in accordance with the output of the voltage comparator. The inverter means comprises a first ring modulator having an input coupled to the input means, an input connected to the output of the voltage comparator and an output coupled to the input of the voltage-controlled oscillator. The inverter means further comprises a second ring modulator having an input coupled to the output of the first phase detector, an input connected to the output of the voltage comparator and an output connected to the output means.

The voltage comparator comprises a low-pass filter connected in the input thereof. A phase shifter has an input coupled to the output of the voltage-controlled oscillator and an output coupled to the output of the second phase detector for shifting the phase of the second phase detector relative to that of the first phase detector.

The voltage comparator includes means for memorizing the polarity of the output of the second phase detector or the result of the discrimination of the polarity.

In order that the invention may be readily carried into effect, it will now be described with reference to the accompanying drawings, wherein:

FIG. 1 is a circuit diagram of an embodiment of the phase-controlled oscillator of the invention;

FIG. 2*a* is a graphical presentation illustrating voltages appearing in the circuit of FIG. 1;

FIG. 2*b* is a graphical presentation of a voltage appearing in the circuit of FIG. 1;

Figure 1:
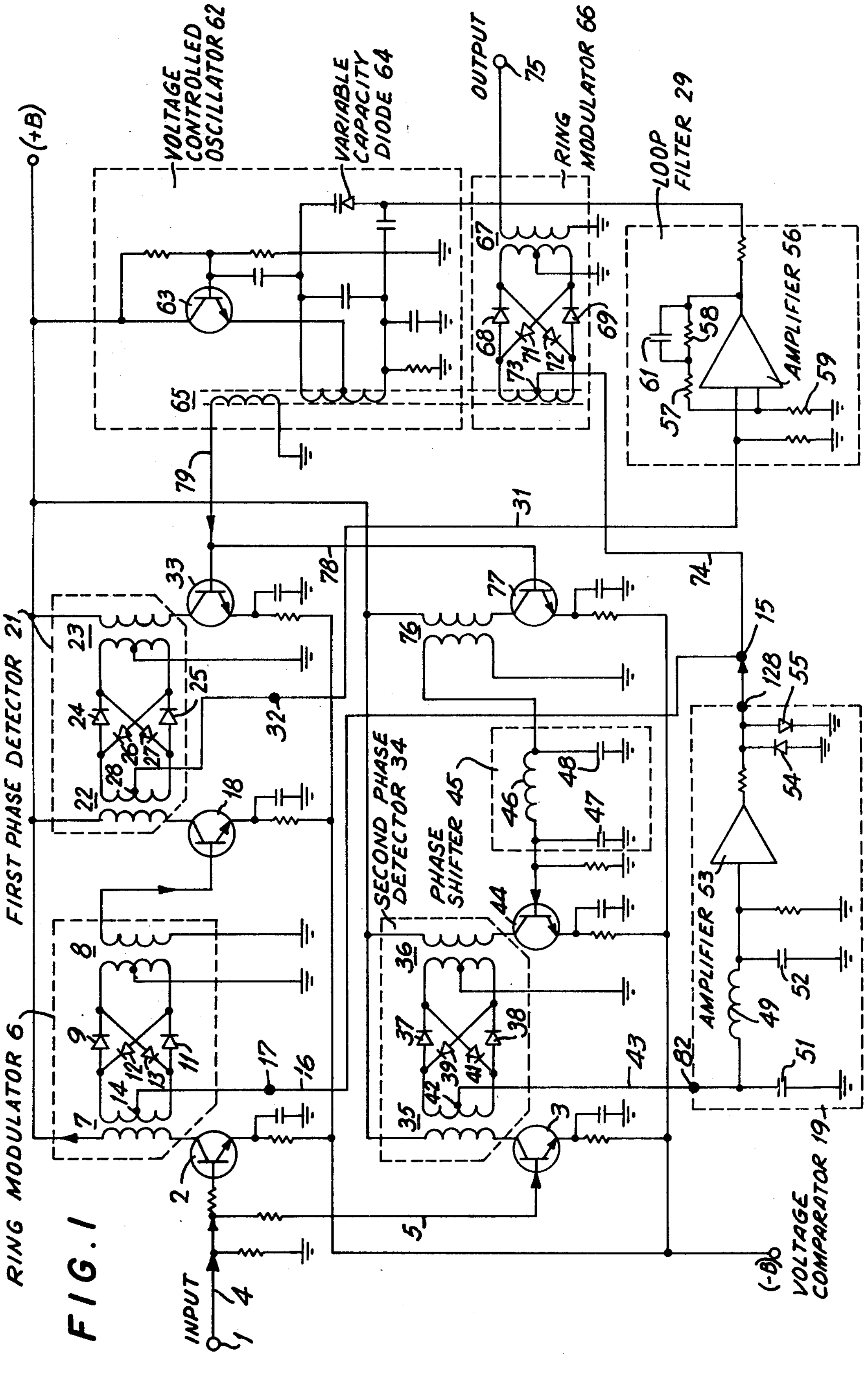

In FIG. 1, input signals are supplied to an input terminal 1. The input signals are supplied in common to each of a transistor 2 and a transistor 3. Each of the transistors 2 and 3 is connected as and functions as an amplifier circuit. The input signal is supplied to the transistor 2 via the input terminal 1 and a lead 4. The input signal is supplied to the transistor 3 via the input terminal 1, the lead 4 and a lead 5.

The output of the transistor amplifier 2, which is the collector electrode of said transistor, is connected to the input of a ring modulator 6. The ring modulator 6 may comprise any suitable ring modulator of known type such as, for example, an input transformer 7, an output transformer 8, and a plurality of diodes 9, 11, 12, and 13, connected, as shown in FIG. 1, between the secondary winding of said input transformer and the primary winding of said output transformer.

The secondary winding of the input transformer 7 of the ring modulator 6 has a center tap 14 which is connected to a circuit point 15 via a lead 16 and a circuit point 17 in said lead. The secondary winding of the output transformer 8 of the ring modulator 6 is connected to the input of a transistor 18, which is connected as a transistor amplifier. If the voltage at the circuit point 17 is positive, the input signals supplied to the input terminal 1 are supplied to the transistor amplifier 18 without phase inversion. If the voltage at the circuit point 17 is negative, the input signals are supplied to the transistor amplifier 18 with inverted phase. A voltage comparator 19 has an output connected to the center tap 14 of the input transformer 7 of the ring modulator 6 via the circuit point 15, the circuit point 17 and the lead 16.

The output of the transistor amplifier 18, which is the collector electrode of said transistor, is connected to the input of a first phase detector 21. The first phase detector 21 may comprise any suitable phase detector known in the art and may comprise, for example, a circuit identical to the ring modulator 6. In FIG. 1, the first phase detector 21 comprises an input transformer 22, an output transformer 23 and a plurality of diodes 24, 25, 26, and 27 connected between the secondary winding of said input transformer and the primary winding of said output transformer in the manner shown in the Figure. The secondary winding of the input transformer 22 has a center tap 28 connected to the input of a loop filter 29 via a lead 31 and a circuit point 32 in said lead.

The secondary winding of the output transformer 23 of the first phase detector 21 is connected to the input of a transistor 33, which transistor is connected as a transistor amplifier. The first phase detector 21 produces a cosine-type signal which corresponds to the phase difference between the signals supplied to the transistor amplifiers 18 and 33. The output signals produced by the first phase detector 21 are shown in FIG. 2*a*.

Figure 2A:
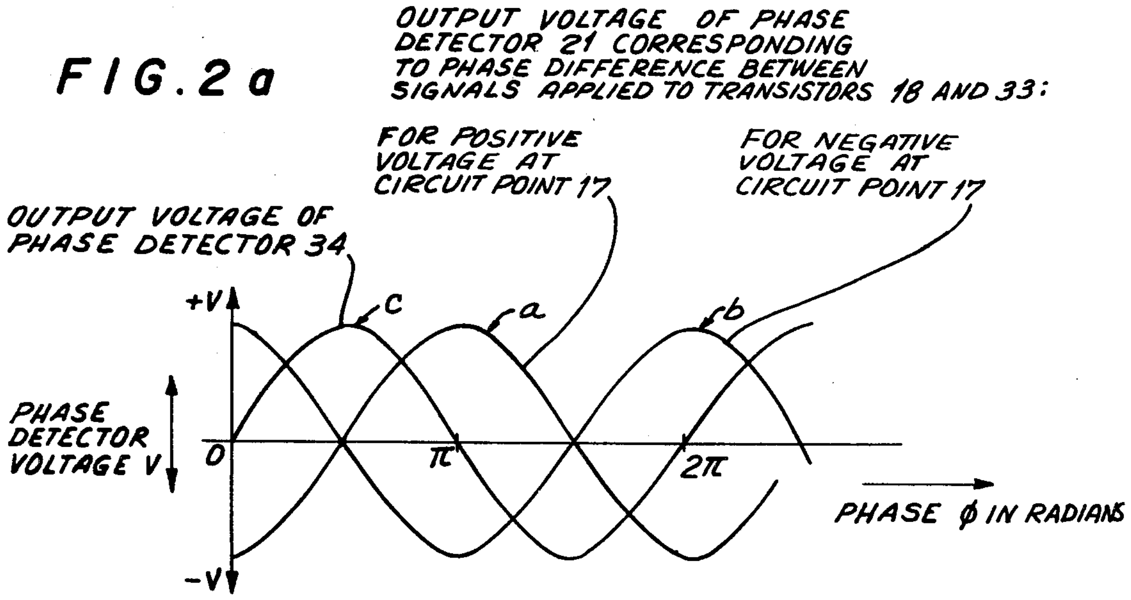
Figure 2B:
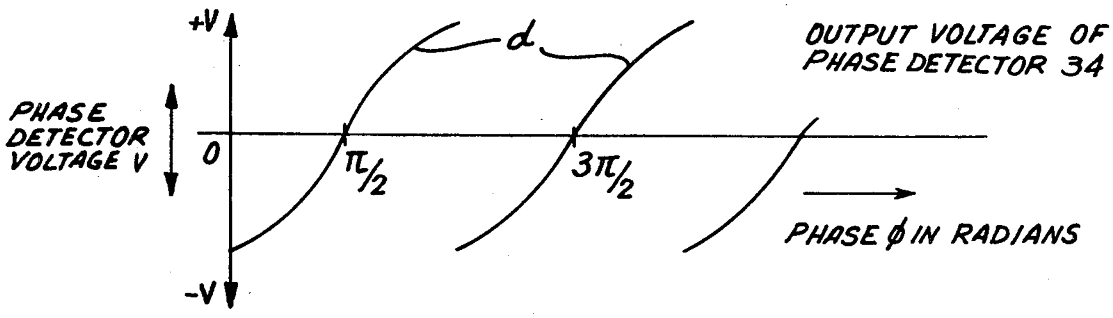

In each of FIGS. 2*a* and 2*b*, the abscissa represents the phase Φ in radians and the ordinate represents the phase detector voltage V in volts. In FIG. 2*a*, the curve *a* represents the output voltage of the first phase detector 21 when a positive voltage is applied to the circuit point 17. The curve *b* represents the output voltage of the first phase detector 21 when a negative voltage is applied to the circuit point 17. The curves *a* and *b* of FIG. 2*a* differ in phase from each other by π radians because, as hereinbefore described, the phase is shifted 180° by the polarity of the input voltage of the ring modulator 6.

The output of the transistor amplifier 3, which is the collector electrode of said transistor, is connected to the input of a second phase detector 34. The second phase detector 34 may comprise any suitable phase detector known in the art and may be identical to the first phase detector 21 and to the ring modulator 6. In FIG. 1, the second phase detector 34 comprises an input transformer 35, an output transformer 36 and a plurality of diodes 37, 38, 39 and 41 connected between the secondary winding of said input transformer and the primary winding of said output transformer. The secondary winding of the input transformer 35 of the second phase detector 34 has a center tap which is connected to the input of the voltage comparator 19 via a lead 43. The phase of the transistor amplifier 3 is the same as the phase of the transistor amplifier 2.

A transformer 76 has a secondary winding connected to the input of the phase shifter 45 in FIG. 1, and a primary winding connected to the output of a transistor 77. The transistor 77 is connected as a transistor amplifier. The input of the transistor amplifier, which is the base electrode of said transistor, is connected to the output of the voltage controlled oscillator 62, and the input of the transistor amplifier 33, which is the base electrode of said transistor amplifier, is connected to the output of the voltage-controlled oscillator 62. The inputs of the transistor amplifiers 33 and 77 are connected in common to the secondary winding of the transformer 65 via a lead 79 and provide the output of voltage-controlled oscillator 62.

The secondary winding of the output transformer 36 of the second phase detector 34 is connected to the output of a transistor 44. The transistor 44 is connected as a transistor amplifier. The input of the transistor amplifier 44, which is the base electrode of said transistor, is connected to the output of a phase shifter 45. The phase shifter 45 comprises an inductor 46, in series connection, and a pair of capacitors 47 and 48 in π connection with said inductor. The phase shifter 45 is a phase shifter of π/2 radians.

Figure 3:
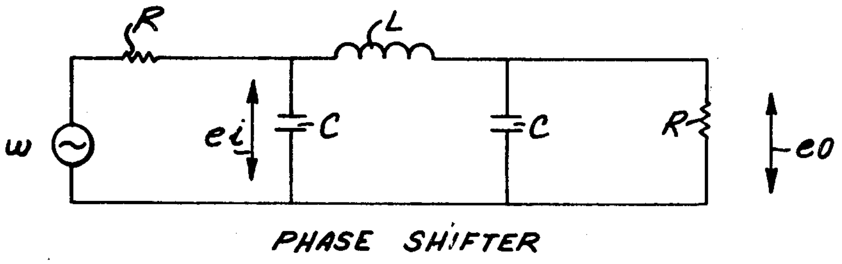
FIG. 3 is a circuit diagram of the phase shifter of FIG. 1.

FIG. 3 shows a circuit arrangement for the phase shifter 45. The circuit arrangement of FIG. 3 is actually an equivalent circuit, illustrating the principle of operation of the phase shifter 45. There is a phase difference of π/2 radians between the input voltage *ei* and the output voltage *eo* of the phase shifter, when the inductance L of the inductor 46 equals R/ω and the capacitance C of the capacitors 47 and 48 equals 1/ωR. In the foregoing relations, ω is the angular frequency 2π*f* and R is the characteristic impedance. The phase of the second phase detector 34 is therefore shifted by π/2 radians relative to the phase of the first phase detector 21. The output of the second phase detector 34 is illustrated in the curve *c* of FIG. 2*a*.

The voltage comparator 19 comprises a low-pass filter connected in its input. The low-pass filter comprises a π connection of an inductor 49 and capacitors 51 and 52. The low-pass filter 49, 51, 52 of the voltage comparator 19 removes the unnecessary higher harmonic components of the second phase detector 34. The voltage comparator 19 comprises a high-gain linear amplifier 53 and a pair of diodes 54 and 55 connected in parallel to the output thereof.

The high-gain linear amplifier 53 and the diodes 54 and 55 function as a voltage comparator which discriminates or determines the polarity corresponding to the sign or polarity of the output of the low-pass filter 49, 51, 52. The voltage comparator produces a constant voltage which is positive or negative. The output voltage of the voltage comparator is positive when the phase difference Φ is between zero radians and π radians and said output voltage is negative when said phase difference is between π radians and 2π radians.

The output of the first phase detector 21 is therefore illustrated by the curve *a* of FIG. 2*a*, when the phase difference Φ is between zero radians and π radians and is represented by the curve *b* of said FIG. when said phase difference is between π radians and 2π radians. The output voltage of the first phase detector 21 is represented by the curve *d* of FIG. 2*b*.

The loop filter 29 comprises a wide-band linear amplifier 56, a plurality of resistors 57, 58 and 59 and a capacitor 61 connected in shunt with the resistor 58.

A voltage-controlled oscillator 62 is of Hartley-type and comprises a transistor 63, a variable capacity diode 64 and an oscillator transformer 65. The first phase detector 21, the loop filter 29 and the voltage-controlled oscillator 62 comprises a phase-locked loop. The loop comprising the first phase detector 21, the loop filter 29 and the voltage-controlled oscillator 62 becomes stable at the point of π/2 radians or 3π/2 radians, as illustrated in FIG. 2*b*.

When the initial phase is between zero and π radians, the loop comprising the first phase detector 21, the loop filter 29 and the voltage-controlled oscillator 62 is locked at the stable point of π/2 radians. When the initial phase is between π and 2π radians, the loop 21, 29, 62 is locked at the stable point of 3π/2 radians. The loop thus has two stable points at 2π radians, and this results in the output signals being uncertain. However, as indicated in the curve *c* of FIG. 2*a*, the output voltage of the second phase detector 34 is positive at the stable point of π/2 radians and negative at the stable point of 3π/2 radians. Therefore, utilizing this property, the normal condition or state may be restored.

More particularly, a ring modulator 66 comprises an output transformer 67 and a plurality of diodes 68, 69, 71 and 72 connected, as illustrated, between a tertiary winding of the transformer 65 of the voltage-controlled oscillator 62 and the primary winding of the transformer 67. The tertiary winding of the transformer 65 has a center tap 73 which is connected to the output of the voltage comparator 19 via a lead 74 and the circuit point 15 in said lead. Therefore, if the stable point is at π/2 radians, that is, if the output voltage of the second phase detector 34 is positive, the output phase of the voltage-controlled oscillator 62 is not inverted. If the sable point is at 3π/2 radians, that is, if the output voltage of the second phase detector 34 is negative, the phase of the voltage-controlled oscillator 62 is inverted by the ring modulator 66 and said ring modulator produces an output signal at an output terminal 75 connected to the secondary winding of the output transformer 67 thereof.

Due to the foregoing operation, and in accordance with the invention, the ambiguity of the output phase may be eliminated, and, since there are two stable points at 2π radians, the maximum phase at the time of pulling in may be π/2 radians. Furthermore, the phase characteristic of the phase-locked loop 21, 29, 62 is similar to a sawtooth configuration and the pulling in is at very high speed.

Any suitable phase detector may be utilized as a first phase detector 21 or the second phase detector 34 of FIG. 1. Any suitable phase inverter may be utilized as the ring modulator 6 or the ring modulator 66. Any suitable phase shifter may be utilized as the phase shifter 45. Any suitable loop filter may be utilized as the loop filter 29. Any suitable voltage-controlled oscillator may be utilized as the voltage-controlled oscillator 62.

The phase-controlled oscillator of the invention may be utilized to produce bit clocks utilized for the demodulation of burst signals in time-deviation satellite communication system, or the like. Burst signals in a satellite communication system are a group of signals allotted to a plurality of ground or earth stations in the system. Each of the burst signals comprises, for example, a satellite signal, a bit clock-regenerating signal, a station-discriminating signal, data signals, and additional signals.

In a satellite communication system, the data is demodulated by the bit clock-regenerating signal transmitted before the date signals and a signal extracted from the data. However, it is also possible in some cases, that it is impossible to extract the bit block signal in the demodulation of data. In such case, the proper control signal cannot be produced at the output of the voltage comparator 19 of FIG. 1. My invention has solved this problem by providing the voltage comparator 19 so that it not only discriminates or determines the polarity and transmits the results as output signals, but also memorizes or stores the polarity or the result of the discrimination or determination of such polarity.

Figure 4:
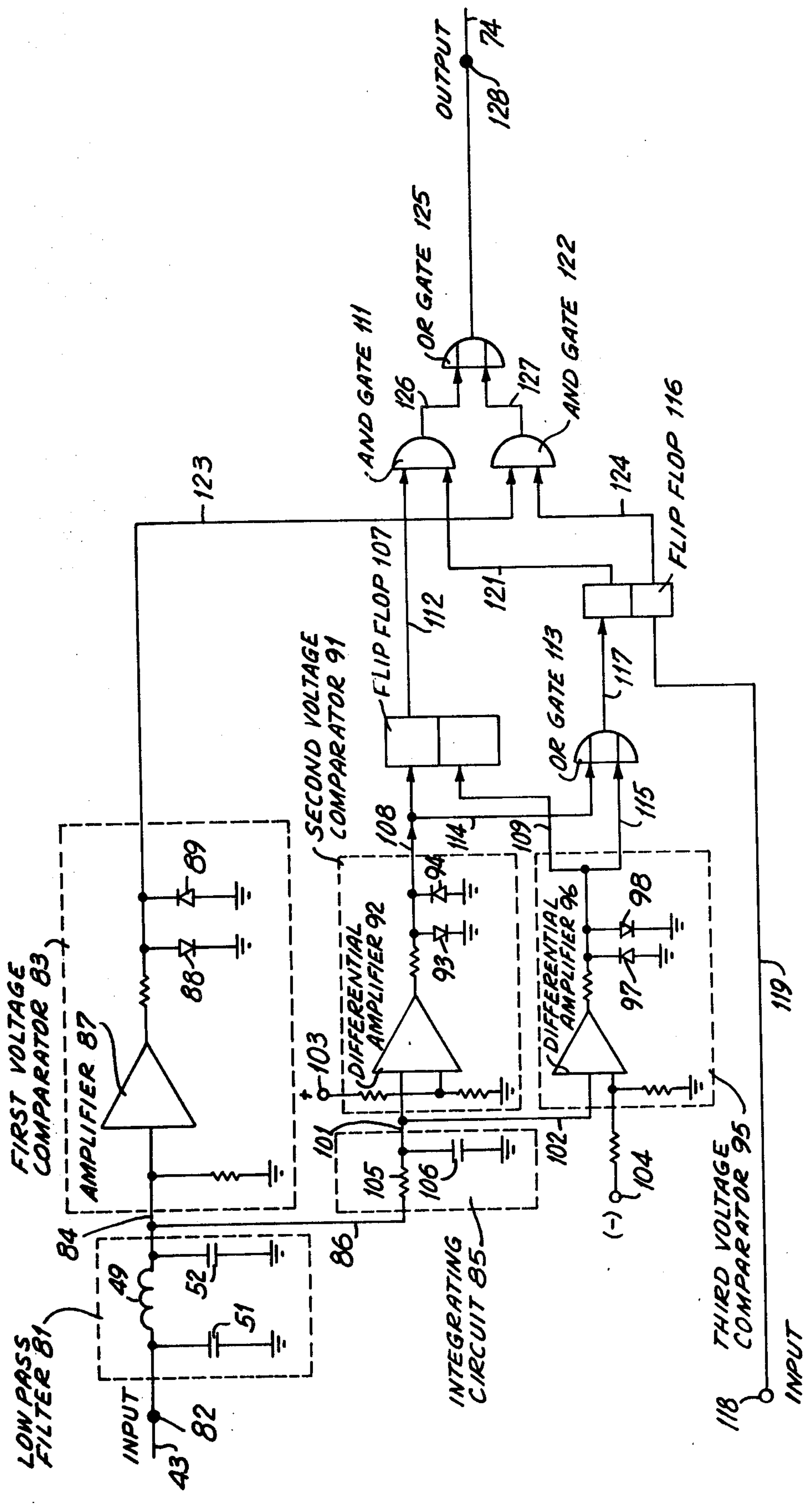
FIG. 4 is a circuit diagram of an embodiment of a voltage comparator which may be utilized as the voltage comparator of FIG. 1.

FIG. 4 illustrates an embodiment of a voltage comparator circuit which may be utilized as the voltage comparator 19 of FIG. 1. In FIG. 4, a low-pass filter 81 comprises the inductor 49 and the capacitors 51 and 52 of the voltage comparator 19 of FIG. 1. The input of the low-pass filter 81 is connected to the lead 43 from the second phase detector 34 (FIG. 1) via a circuit point 82 The output of the low-pass filter 81 is connected to the input of a first voltage comparator 83 via a lead 84 and is also connected to the input of an integrating circuit 85 via the lead 84 and a lead 86.

The voltage comparator 83 comprises a high-gain linear amplifier 87 and a pair of diodes 88 and 89 connected in parallel, with opposite polarities, at the output of said amplifier. The operation of the voltage comparator 83 is similar to that of the voltage comparator 19 of FIG. 1.

A second voltage comparator 91 comprises a differential amplifier 92 and a pair of diodes 93 and 94 connected in parallel, in opposite polarities, at the output of said differential amplifier. A third voltage comparator 95 comprises a differential amplifier 96 and a pair of diodes 97 and 98, connected in parallel with opposite polarities, at the output of said differential amplifier. The second and third voltage comparators 91 and 95 are thus similar.

In each of the differential amplifiers 92 and 96, a positive or a negative bias voltage is applied to one of the two input terminals of said amplifier. If the input to the other input terminal of the differential amplifier is greater than the bias voltage, a positive output voltage is produced by the differential amplifier 92 and a negative output voltage is produced by the differential amplifier 96.

The output of the integrating circuit 85 is connected to one of the inputs of the differential amplifier 92 via a lead 101. The output of the integrating circuit 85 is connected to an input of the differential amplifier 96 via the lead 101 and a lead 102. A positive biasing voltage is applied to the other input of the differential amplifier 92 via an input terminal 103. A negative biasing voltage is applied to the other input of the differential amplifier 96 via an input terminal 104.

The integral circuit 85 comprises a resistor 105, connected in series, and a capacitor 106, connected in parallel with said resistor. The time constant $\tau$ of the integrating circuit 85 equals the resistance R105 of the resistor 105 times the capacitance C106 of the capacitor 106.

A flip-flop 107 has a set input connected to the output of the second voltage comparator 91 via a lead 108. The flip-flop 107 has a reset input connected to the output of the third voltage comparator 95 via a lead 109. The flip-flop 107 has an output connected to a first input of an AND gate 111 via a lead 112.

An OR gate 113 has a first input connected to the output of the second voltage comparator 91 via the lead 108 and a lead 114. The OR gate 113 has a second input connected to the output of the third voltage comparator 95 via a lead 115. A flip-flop 116 has a set input connected to the output of the OR gate 113 via a lead 117. The flip-flop 116 has a reset input connected to an input terminal 118 via a lead 119. The flip-flop 116 has a set output connected to the second input of the AND gate 111 via a lead 121.

An AND gate 122 has a first input connected to the output of the first voltage comparator 83 via a lead 123. The AND gate 122 has a second input connected to the reset output of the flip-flop 116 via a lead 124. An OR gate 125 has a first input connected to the output of the AND gate 111 via a lead 126. The OR gate 125 has a second input connected to the output of the AND gate 122 via a lead 127. The output of the OR gate 125 is connected to the lead 74 of FIG. 1 via a circuit point 128.

Each of the flip-flops 107 and 116 comprises a well-known bistable multivibrator or flip-flop circuit. Each of the AND gates 111 and 122 comprises a well-known AND circuit. Each of the OR gates 113 and 125 comprises a well-known OR circuit.

A control signal, which is a binary 1 signal when no burst signal is applied and is a binary 0 signal when a burst signal is applied, is supplied to the input terminal 118 of the voltage comparator 83 of FIG. 4. The flip-flop 116 is in its reset or zero condition at the head of a burst. When the flip-flop 116 is in its reset condition, the output voltage produced by the voltage comparator 83 is transferred via the AND gate 122 and the OR gate 125 to the output lead 74 via the circuit point 128.

The aforedescribed condition is completely the same as that explained with reference to FIG. 1, enabling a high-speed or rapid pulling in. Consequently, the phase-locked loop 21, 29, 62 is pulled into the phase of $\pi$/radians or $3\pi/2$ radians, and, as shown in FIG. 2*b*, a positive or negative DC voltage is applied to the output of the second phase detector 34 (FIG. 1). Thus, a positive or negative DC voltage is applied to the input lead 43 of the voltage comparator 19 (FIG. 1). The DC voltage is applied to the integrating circuit 85 and the output voltage of said integrating circuit is increased exponentially.

When the output voltage of the integrating circuit 85 exceeds the bias voltage applied to the differential amplifier 92 or the bias voltage applied to the differential amplifier 96, that is, when the output voltage of s aid integrating circuit approaches a stable point of, for example, $\pi/2$ radians and exceeds a specific positive voltage, the differential amplifier 92 is switched from a binary 0 condition to a binary 1 condition. Consequently, the flip-flop 107 is switched to its set or 1 condition.

When the flip-flops 107 or 116 are in their set condition, the phase-locked loop 21, 29, 62 is pulled in to the point of $\pi/2$ radians. The output signal of the flip-flop circuit 107 is therefore transferred to the output lead 74, instead of the output signal of the first voltage comparator 83. The output signal of the flip-flop 107 is transferred to the output lead 74 via and AND gate 111 and the OR gate 125. At such time, the output signal in the lead 74 is a binary 1.

When the phase-locked loop 21, 29, 62 (FIG. 1) is pulled in to the point of $3\pi/2$ radians, the differential amplifier 96 produces a binary 1 output signal after a specified period of time. Consequently, the flip-flop 107 is switched to its reset or 0 condition and the flip-flop 116 is switched to its set or 1 condition. A 0 signal is thus provided in the output lead 74. That is, the flip-flop 116 memorizes whether or not the pulling-in to the phase is completed and the flip-flop 107 indicates into which of the phase of $\pi/2$ or $3\pi/2$ radians the phase-locked loop 21, 29, 62 (FIG. 1) is pulled when the flip-flop 116 is in its set condition, that is, after the completion of the pulling-in to the phase. The integrating circuit 85 removes the noise component of the input, and the time constant is determined from the period of time required for the pulling in to the phase.

When the burst is cut off, the control signal at the input terminal 118 of FIG. 4 becomes 1 and the flip-flop circuit 116 is switched to its reset condition, so that the initial condition of the circuit is restored. Due to the memorization or storage of the condition by the aforedescribed memory circuit, it is possible to provide correct output signals, even when the input signals are cut off for a specific period of time, while the phase-controlled oscillator is utilized for the regeneration of bit clocks, or for other purposes.

The circuit of the invention may be utilized effectively not only for burst signals, but also for discontinuous bit synchronization signals.

While the invention has been described by means of a specific example and in a specific embodiment, I do not wish to be limited thereto, for obvious modifications will occur to those skilled in the art without departing from the spirit and scope of the invention.

I claim:

1. A phase-controlled oscillator having a loop comprising phase-detecting means, a loop filter connected to said phase-detecting means and a voltage-controlled oscillator connected to said phase-detecting means and said loop filter, said voltage-controlled oscillator providing an output signal, said phase-detecting means comparing an input signal with the output signal of said voltage-controlled oscillator, input means for supplying an input signal to said phase-detecting means and output means for deriving the output signal from said voltage-controlled oscillator, said phase-detecting means comprising a first phase detector coupling said input means to said voltage-controlled oscillator, a second phase detector having a comparison phase which differs from that of said first phase detector by $\pi/2$ radians, said second phase detector being coupled to said input means, a voltage comparator coupled to said second phase detector for discriminating the polarity of the output of said second phase detector, inverter means coupled to said first phase detector, to said voltage comparator and to said voltage-controlled oscillator for inverting the phase of the input to said first phase detector in accordance with the output of said voltage comparator and for shifting the phase of the output of said phase-controlled oscillator by $\pi$ radians in accordance with the output of said voltage comparator.

2. A phase-controlled oscillator as claimed in claim 1, wherein said inverter means comprises a first ring modulator having an input coupled to said input means, an input connected to the output of said voltage comparator and an output coupled to the input of said first phase detector.

3. A phase-controlled oscillator as claimed in claim 1, wherein said inverter means comprises a second ring modulator having an input coupled to the output of said first phase detector, an input connected to the output of said voltage comparator and an output connected to said output means.

4. A phase-controlled oscillator as claimed in claim 1, wherein said inverter means comprises a first ring modulator having an input coupled to said input means, an input connected to the output of said voltage comparator and an output coupled to the input of said first phase detector and a second ring modulator having an input coupled to the output of said first phase detector, an input connected to the output of said voltage comparator and an output connected to said output means.

5. A phase-controlled oscillator as claimed in claim 1, wherein said voltage comparator comprises a low-pass filter connected in the input thereof.

6. A phase-controlled oscillator as claimed in claim 1, further comprising a phase shifter having an input coupled to the output of said voltage-controlled oscillator and an output coupled to the input of said second phase detector for shifting the phase of said second phase detector relative to that of said first phase detector.

7. A phase-controlled oscillator as claimed in claim 1, wherein said voltage comparator includes means for memorizing the polarity of the output of said second phase detector or the result of the discrimination of said polarity.

PO-1050
(5/69)

UNITED STATES PATENT OFFICE
CERTIFICATE OF CORRECTION

Patent No. 3,605,033 Dated September 14, 1971

Inventor(s) HIROSHI NAKAMURA

It is certified that error appears in the above-identified patent and that said Letters Patent are hereby corrected as shown below:

The date the patent was issued should read

--September 14, 1971--

Signed and sealed this 4th day of April 1972.

SEAL)
ttest:

DWARD M.FLETCHER,JR.
ttesting Officer

ROBERT GOTTSCHALK
Commissioner of Patents